United States Patent
Lee

(10) Patent No.: US 9,793,222 B1
(45) Date of Patent: Oct. 17, 2017

(54) SUBSTRATE DESIGNED TO PROVIDE EMI SHIELDING

(71) Applicant: Apple Inc., Cupertino, CA (US)

(72) Inventor: MyungHo Lee, Incheon (KR)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 15/135,071

(22) Filed: Apr. 21, 2016

(51) Int. Cl.
| | |
|---|---|
| *H01L 23/552* | (2006.01) |
| *H01L 21/78* | (2006.01) |
| *H01L 23/31* | (2006.01) |
| *H01L 23/498* | (2006.01) |
| *H01L 23/00* | (2006.01) |
| *H01L 21/56* | (2006.01) |
| *H01L 21/3205* | (2006.01) |
| *H01L 21/48* | (2006.01) |
| *H01L 21/683* | (2006.01) |
| *H01L 25/00* | (2006.01) |
| *H01L 25/065* | (2006.01) |

(52) U.S. Cl.
CPC ...... *H01L 23/552* (2013.01); *H01L 21/32051* (2013.01); *H01L 21/4853* (2013.01); *H01L 21/561* (2013.01); *H01L 21/565* (2013.01); *H01L 21/6835* (2013.01); *H01L 21/78* (2013.01); *H01L 23/3128* (2013.01); *H01L 23/49811* (2013.01); *H01L 23/49838* (2013.01); *H01L 24/17* (2013.01); *H01L 24/81* (2013.01); *H01L 24/97* (2013.01); *H01L 25/0655* (2013.01); *H01L 25/50* (2013.01); *H01L 2224/16227* (2013.01); *H01L 2924/01029* (2013.01); *H01L 2924/15311* (2013.01); *H01L 2924/3025* (2013.01)

(58) Field of Classification Search
CPC .............. H01L 23/552; H01L 23/3128; H01L 23/4981; H01L 23/49838; H01L 21/32051; H01L 21/561; H01L 21/4853; H01L 21/6835; H01L 21/78; H01L 24/81; H01L 24/97; H01L 24/17; H01L 25/0655; H01L 25/50; H01L 21/565; H01L 23/55; H01L 23/49811
See application file for complete search history.

(56) References Cited

U.S. PATENT DOCUMENTS

| | | | |
|---|---|---|---|
| 8,012,868 B1 | 9/2011 | Naval et al. | |
| 8,084,300 B1 * | 12/2011 | San Antonio | H01L 21/568 257/E21.602 |

(Continued)

OTHER PUBLICATIONS

U.S. Appl. No. 15/042,817, "Substrate-Less Integrated Components" filed Feb. 12, 2016, 44 pages.

*Primary Examiner* — Fazli Erdem
(74) *Attorney, Agent, or Firm* — Blakely, Sokoloff, Taylor & Zafman LLP

(57) ABSTRACT

Packages and packaging techniques for providing EMI shielding are described. In an embodiment, a package includes an electrically conductive ground structure on a ground pad at a periphery of a package substrate. The electrically conductive ground structure is encapsulated in a molding compound, and a surface of the electrically conductive ground structure is exposed at a side surface of the molding compound. An electrically conductive shield layer is on top and side surfaces of the molding compound, and in physical contact with the surface of the exposed electrically conductive ground structure.

17 Claims, 13 Drawing Sheets

(56) References Cited

U.S. PATENT DOCUMENTS

| | | | |
|---|---|---|---|
| 8,115,283 B1* | 2/2012 | Bolognia | B81B 7/0064 |
| | | | 257/659 |
| 8,129,824 B1 | 3/2012 | St. Amand et al. | |
| 2007/0267734 A1* | 11/2007 | Zhao | H01L 21/561 |
| | | | 257/687 |
| 2008/0272469 A1* | 11/2008 | Kwak | H01L 21/561 |
| | | | 257/659 |
| 2009/0194852 A1* | 8/2009 | Chiu | H01L 21/568 |
| | | | 257/660 |
| 2010/0109132 A1* | 5/2010 | Ko | H01L 21/561 |
| | | | 257/660 |
| 2012/0075821 A1* | 3/2012 | Pagaila | H01L 23/3677 |
| | | | 361/783 |
| 2013/0256847 A1* | 10/2013 | Park | H01L 23/585 |
| | | | 257/659 |
| 2014/0048913 A1* | 2/2014 | Park | H01L 23/552 |
| | | | 257/659 |
| 2014/0284775 A1 | 9/2014 | Nomura | |
| 2015/0070046 A1 | 3/2015 | Takano et al. | |
| 2015/0296667 A1* | 10/2015 | Hirose | H01L 21/568 |
| | | | 427/126.2 |
| 2017/0135219 A1* | 5/2017 | Hsu | H05K 1/111 |

* cited by examiner

SUBSTRATE DESIGNED TO PROVIDE EMI SHIELDING

BACKGROUND

Field

Embodiments described herein relate to electronic packaging. More particularly, embodiments relate to packaging techniques for providing electro-magnetic interference (EMI) shielding.

Background Information

Plastic ball grid array (BGA) substrates are commonly used for memory, controller, and chipset applications amongst others. BGA substrates are commonly sold in the strip form, and including one or more build-up layers, and optionally a core. A common BGA package assembly process may include using an off-the shelf BGA substrate strip, mounting a plurality of die and components onto the BGA substrate strip, and encapsulating the plurality of die and components in a molding compound on the BGA strip. A plurality of packages may then be singulated from the molded BGA substrate strip.

In some applications, electro-magnetic interference (EMI) shielding is formed on the singulated packages in order to either mitigate EMI radiation from the package or to prevent EMI radiation from external sources from interfering with operation of the package. In one implementation an EMI shielding layer is formed over the molding compound and side surfaces of the singulated BGA substrate so that the EMI shielding layer is in direct contact with an exposed ground wire within the BGA substrate. If the electrical connection between the EMI shielding layer and the exposed ground wire is defective, the EMI shielding effect may not be achieved.

SUMMARY

Packages and packaging techniques for providing EMI shielding are described. In an embodiment, a package includes a package substrate including a top surface and a bottom surface. A die is bonded to the package substrate top surface, and a ground pad is located at a periphery of the package substrate top surface. In accordance with embodiments, an electrically conductive ground structure is on (e.g. bonded to) the ground pad. A molding compound encapsulates the die and the electrically conductive ground structure on the package substrate top surface. The molding compound includes a top surface and side surfaces, and a surface of the electrically conductive ground structure is exposed at a side surface of the molding compound. An electrically conductive shield layer (e.g. EMI shielding layer) is on the top and side surfaces of the molding compound, and in physical contact with the surface of the exposed electrically conductive ground structure.

The package substrate may be a variety of substrates, such as a printed circuit board (PCB). In an embodiment, the package substrate includes one or more metal routing layers, and the electrically conductive ground structure is thicker than every metal routing layer in the package substrate. In some embodiments, the electrically conductive shield layer is not formed on side surfaces of the package substrate. The electrically conductive ground structure may also or alternatively be wider than the metal routing layer(s).

In some embodiments, the ground pad may be a ground pad ring at the periphery of the package substrate top surface. In some embodiments, the package includes a plurality of ground pads at the periphery of the package substrate top surface, and a plurality of electrically conductive ground structures on the plurality of ground pads. In such an arrangement, a corresponding plurality of surfaces of the plurality of electrically conductive ground structures are exposed at side surfaces of the molding compound, and the electrically conductive shield layer is in physical contact with the plurality of surfaces of the plurality of exposed electrically conductive ground structures. A variety of electrically conductive ground structures may be utilized, such as, a wire bond, pillar, solder ball, cored ball, and chip with electrical routing. In some embodiments, the plurality of electrically conductive ground structures are wire bonds.

The package may additionally include a plurality of bond pads adjacent a periphery of the package substrate bottom surface. In an embodiment, the plurality of ground pads may be located nearer the periphery of the package substrate top surface, than the plurality of bond pads are to the periphery of the package substrate bottom surface. A plurality of solder bumps may be attached to the plurality of bond pads. The plurality of ground pads may be electrically connected to one or more of the plurality of solder bumps, or magnetically connected to one or more of the plurality of solder bumps.

In an embodiment, a method of forming a package includes attaching a die to the top surface of the wiring substrate, attaching a plurality of electrically conductive ground structures to a plurality of ground pads at the top surface of the wiring substrate, encapsulating the die and the plurality of electrically conductive ground structures within a molding compound, cutting through the molding compound and the plurality of electrically conductive ground structures to expose a corresponding plurality of surfaces of the plurality of electrically conductive ground structures at cut side surfaces of the molding compound, and depositing an electrically conductive shield layer on a top surface and the cut side surfaces of the molding compound, and in physical contact with the plurality of surfaces of the exposed electrically conductive ground structures at the cut side surfaces of the molding compound.

The packaging methods may be compatible with both half cut and full cut singulation. In a half cut method, the initial cut through the molding compound and the plurality of electrically conductive ground structures does not extend completely through the supporting wiring substrate. In such an embodiment, a sequential dicing operation is performed through the conductive shield layer and the wiring substrate to singulate a package. Additionally, a plurality of solder balls may be placed on a bottom of the wiring substrate prior to dicing though the wiring substrate and the electrically conductive shield layer to singulate the package. In a full cut method, the initial cut through the molding compound and the plurality of electrically conductive ground structures extends completely through the supporting wiring substrate to singulate a package. In such an embodiment, the singulated package may be placed on a temporary carrier, followed by depositing the electrically conductive shield layer on the top surface and the cut side surfaces of the molding compound, and in physical contact with the plurality of surfaces of the exposed electrically conductive ground structures at the cut side surfaces of the molding compound.

In an embodiment, a package is manufactured according to a method including attaching a die to a wiring substrate, bonding a plurality of wires bonds to a plurality of ground pads at a top surface of the wiring substrate and a plurality of dummy pads at the top surface of the wiring substrate, such that each wire bond is bonded to a corresponding ground pad and a corresponding dummy pad, encapsulating the die and the plurality of wire bonds with a molding compound, cutting through the molding compound and the plurality of wire bonds to expose a corresponding plurality of surfaces of the plurality of electrically conductive ground structures at cut side surfaces of the molding compound, and depositing an electrically conductive shield layer on a top surface and the cut side surfaces of the molding compound, and in physical contact with the plurality of surfaces of the exposed plurality of wire bonds at the cut side surfaces of the molding compound.

In an embodiment, cutting through the plurality of wire bonds may include cutting through bond areas of the plurality of wire bonds, such as ball bond areas or wedge bond areas. In an embodiment, cutting through the plurality of wire bonds comprises cutting through wires of the plurality of wire bonds. In an embodiment, cutting through the plurality of wire bonds comprises cutting through bond areas and wires of the plurality of wire bonds.

DETAILED DESCRIPTION

Figure 1:
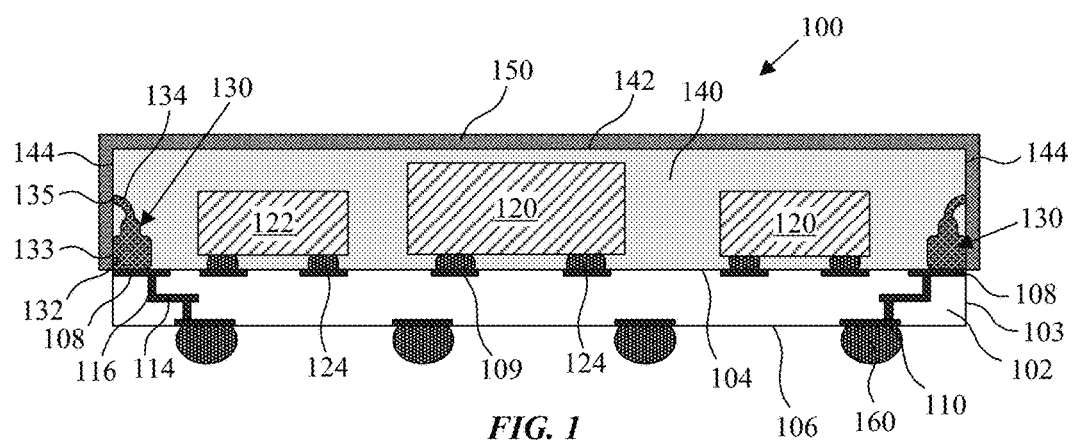
FIG. 1 a schematic cross-sectional side view illustration of a package in accordance with an embodiment.

Embodiments describe packages and package substrates to provide EMI shielding. In an embodiment, a package includes a package substrate with a top surface and a bottom surface. A die is bonded to the package substrate top surface and a ground pad is located at a periphery of the package substrate top surface. An electrically conductive ground structure is on the ground pad, and a molding compound encapsulates the die and the electrically conductive ground structure on the package substrate top surface. The molding compound includes top and side surfaces, and the electrically conductive ground structure is exposed at a side surface of the molding compound. An electrically conductive shield layer (e.g. EMI shield layer) is formed on the top and side surfaces of the molding compound, and in physical contact with the exposed electrically conductive ground structure.

In one aspect, it has been observed that it may be difficult to ensure a reliable electrical connection is made when forming a conventional EMI shield on a singulated package. More specifically, it may be difficult to ensure a reliable connection is made with an exposed ground wire layer located within a package substrate. This may be particularly apparent as package substrate thickness is reduced.

In accordance with embodiments, a variety of electrically conductive ground structures can be bonded to the one or more ground pads at the periphery of the package substrate top surface. For example, the electrically conductive ground structure can be a wire bond, pillar, ball (e.g. solder), cored ball, silicon chip with electrical routing, and combinations thereof, such as a wire bond on a silicon chip. In accordance with embodiments, the electrically conductive ground structures may be thicker and/or wider than the one or more wiring layers located within the package substrate. The ground structure can be thicker and/or wider after cutting through the ground structure, for example in a half cut or full cut process. As a result, the electrically conductive ground structures may provide more surface area for making an electrical connection with an EMI shield layer. Additionally, the electrically conductive ground structures are located over the package substrate, where an EMI shield layer can be more reliably formed.

In various embodiments, description is made with reference to figures. However, certain embodiments may be practiced without one or more of these specific details, or in combination with other known methods and configurations. In the following description, numerous specific details are set forth, such as specific configurations, dimensions and processes, etc., in order to provide a thorough understanding of the embodiments. In other instances, well-known semiconductor processes and manufacturing techniques have not been described in particular detail in order to not unnecessarily obscure the embodiments. Reference throughout this specification to "one embodiment" means that a particular feature, structure, configuration, or characteristic described in connection with the embodiment is included in at least one embodiment. Thus, the appearances of the phrase "in one embodiment" in various places throughout this specification are not necessarily referring to the same embodiment. Furthermore, the particular features, structures, configurations, or characteristics may be combined in any suitable manner in one or more embodiments.

The terms "above", "over", "to", "spanning" and "on" as used herein may refer to a relative position of one layer with respect to other layers. One layer "above", "over", "spanning" or "on" another layer or bonded "to" or in "contact" with another layer may be directly in contact with the other layer or may have one or more intervening layers.

Referring now to FIG. 1 a schematic cross-sectional side view illustration is provided of a package 100 including a package substrate 102 with a top surface 104 and a bottom surface 106. The top surface 104 may include a plurality of contact pads 109 and one or more ground pads 108 located around a periphery of the package substrate 102 top surface 104. As shown, one or more die 120 and/or component(s) 122 may be bonded to the top surface of package substrate top surface 104, for example to contact pads 109 with conductive bumps 124. One or more electrically conductive ground structures 130 is on the one or more ground pads 108, and a molding compound 140 encapsulates the die 120, component(s) 111, and the electrically conductive ground structure(s) 130 on the package substrate top surface 104. The molding compound 140 includes a top surface 142 and side surfaces 144, and the electrically conductive ground structure 130 is exposed at a side surface 144 of the molding compound 140. An electrically conductive shield layer 150 (e.g. EMI shield layer) is formed on the top surface 142 and side surfaces 144 of the molding compound 140, and in physical contact with the exposed electrically conductive ground structure 130.

Package substrate 102 may be a variety of substrates including electrical routing, such as a printed circuit board (PCB). In an embodiment, the package substrate 102 is a wiring board that includes one or more metal routing layers 114 and dielectric layers to provide insulation between the metal routing layers 114. Vias 116 may optionally extend through the one or more dielectric layers to connect metal routing layers 114. In an embodiment, the dielectric layers are laminate resin layers, such as epoxy or bismaleimide-triazine resin, and may include a filler such as glass fibers. Metal routing layers 114 may be plated layers, or foil layers for example. The package substrate 102 may additionally include a core layer, for example, to support a specific coefficient of thermal expansion or provide structural support. The core may be formed of a variety of materials including, but not limited to, semiconductor, ceramic, polymer, glass fiber and resin, and metal.

In an embodiment, a plurality of electrically conductive ground structures 130 are on (e.g. bonded to) the plurality of ground pads 108 at the periphery of the package substrate 102 top surface 104. In the particular embodiment illustrated, the electrically conductive ground structures 130 are wire bonds (as also described with regard to FIG. 6) that include a bond area 132 and optionally a wire 134 extending from the bond area 132. Wire bonding is a solid phase welding process in which a wire and pad surface are brought into intimate contact, in which interdiffusion of atoms typically takes place. During the wire bonding process, a wire 134 is brought into contact with the ground pad 108, with the combination of heat, pressure, and/or ultrasonic energy leading to material deformation of the wire. The bond area 132 may be formed using techniques such as ball bonding (forming a ball bond area) or wedge bonding (forming a wedge bond area). Once the bond area 132 is made, the wire 134 may be broken off, or moved and attached to another pad at the opposite end of the wire 134.

Still referring to FIG. 1, an electrically conductive ground structure 130 wire bond, including a ball bonding bond area 132 and wire 134 are illustrated. As shown, the electrically conductive ground structure 130 is exposed at side surfaces 144 of the molding compound 140. In an embodiment, a surface 133 of the bond area 132 is exposed at the side surfaces 144. In an embodiment, a surface 135 of the wire 134 is exposed at the side surfaces 144. For example, a cross-section of a width or diameter of the wire 134 is exposed. In an embodiment, both surfaces 133, 135 of the bond area 132 and the wire 134 are exposed at the side surfaces 144. In each of the embodiments, an electrically conductive shield layer 150 (e.g. EMI shield layer) is formed on the top surface 142 and side surfaces 144 of the molding compound 140, and in physical contact with the exposed surfaces (e.g. 133, 135) of the electrically conductive ground structure 130. In some embodiments, the electrically conductive shield layer 150 is not formed on side surfaces 103 of the package substrate 102, though the electrically conductive shield layer 150 may be formed on side surfaces 103 of the package substrate 102. The electrically conductive shield layer 150 may optionally be formed on side surfaces of the one or more ground pads 108 arranged around a periphery of the top surface 104 of the package substrate 102.

The package substrate 102 may include one or more bond pads 110 on a bottom surface 106 of the package substrate 102. Conductive bumps 160 (e.g. solder balls) may be attached to the bond pads 110. In an embodiment, one or more of the ground pads 108 are electrically connected to one or more of the bond pads 110, and conductive bumps 160. For example, the electrical connection may be through one or more metal routing layers 114 and vias 116. In one embodiment, the one or more ground pads 108 are magnetically connected to one or more of the bond pads 110, for example, where the electrically conductive ground structure 130 is magnetic (e.g. magnetic wire, ball, etc.)

In an embodiment, the electrically conductive ground structure 130 is thicker than every metal routing layer 114 in the package substrate 102. In an embodiment, the exposed surfaces (e.g. 133 and/or 135) of the electrically conductive ground structure 130 is thicker than every metal routing layer 114 in the package substrate 102. The electrically conductive ground structure 130 may also, or alternatively, be wider than the metal routing 114 (for example at the cut surfaces in contact with the electrically conductive shield layer 150). In one aspect, the increased area and raised elevation above the package substrate 102 may facilitate electrical connection with the electrically conductive shield layer 150. In some embodiments the one or more ground pads 108 are exposed at the side surfaces 103 of the package substrate 102, though this is not necessary.

Figure 2:
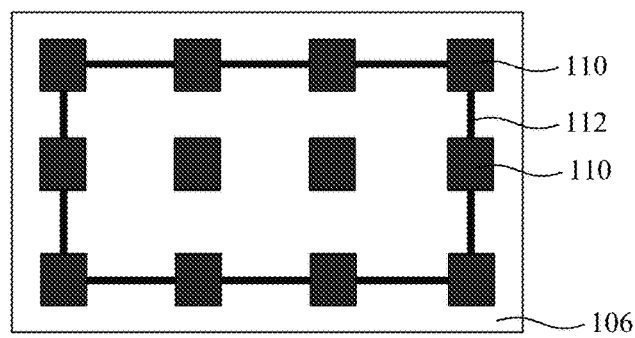
FIG. 2 is a schematic bottom view illustration of a package substrate bottom surface in accordance with an embodiment.

Referring now to FIG. 2, a schematic bottom view illustration is provided of a package substrate 102 bottom surface 106 in accordance with an embodiment. As shown, an arrangement of bond pads 110 are located on the bottom surface 106, and may be electrically connected with the die 120 and/or component(s) 122 within the package, as well as the ground pad(s) 108 on the top surface 104 of the package substrate 102. In an embodiment, a periphery of the bond pads 110 may be electrically connected to each other with interconnects 112.

Figure 3:
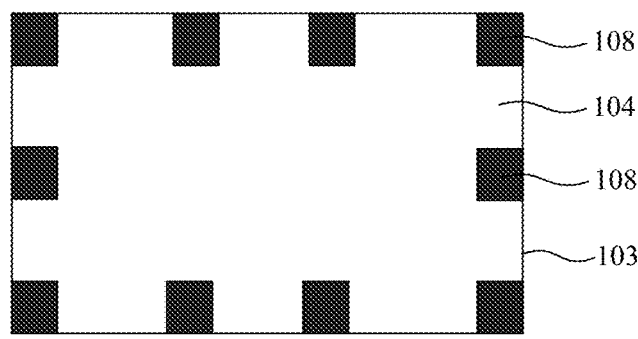
FIGS. 3-4 are schematic top view illustrations of a plurality of ground pads at the periphery of a package substrate top surface in accordance with an embodiment.
Figure 4:
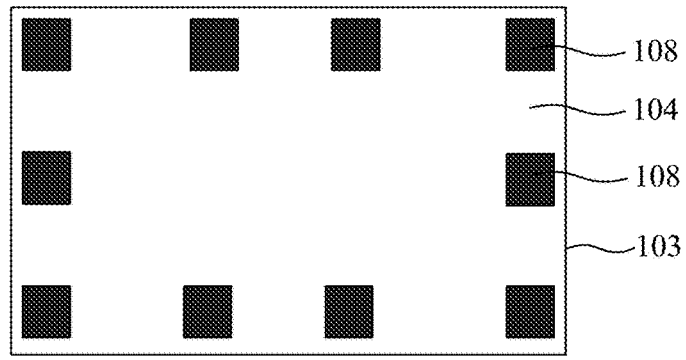
Figure 5:
FIG. 5 is a schematic top view illustration of a ground pad ring at the periphery of a package substrate top surface in accordance with an embodiment.

An exemplary illustration of a plurality of ground pads 108 located around a periphery of the top surface 104 of the package substrate 102 is illustrated in FIG. 3. In the particular embodiment illustrated in FIG. 3, the ground pads 108 may be exposed at the side surfaces 103 of the package substrate 102. However, this is not required. In the embodiment illustrated in FIG. 4 the ground pads 108 may not be exposed at side surfaces 103 of the package substrate 102. For example, the ground pads 108 need not be exposed as long as a portion of the electrically conductive ground structure 130 is exposed at the side surfaces 144 of the molding compound 140 and in electrical connection with the electrically conductive shield layer 150. Furthermore, it is not necessary to include a plurality of separate ground pads 108, and a ground pad 108 ring may alternatively used in accordance with embodiments, as illustrated in FIG. 5. In an embodiment, the plurality of ground pads 108 (or ground ring) are located nearer the periphery of the package substrate top surface 104, than the plurality of bond pads 110 are to the periphery of the package substrate bottom surface 106.

While embodiments thus far have been described and illustrated including a wire bond as the exemplary electrically conductive ground structure 130, embodiments are not so limited, and a variety of electrically conductive ground structures may be used in the packages 100 and fabrication methods described.

Figure 6:
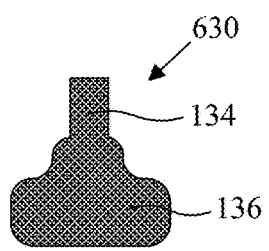
FIG. 6 is a schematic cross-sectional side view illustration of a wire bond in accordance with an embodiment.

FIG. 6 is a schematic cross-sectional side view illustration of a wire bond 630 electrically conductive ground structure 130 in accordance with an embodiment. As previously described with regard to FIG. 1, the wire bond 630 may include a bond area 132 and wire 134.

Figure 7:
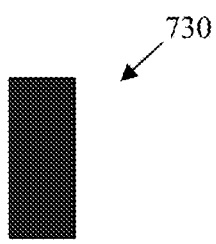
FIG. 7 is a schematic cross-sectional side view illustration of a pillar in accordance with an embodiment.

FIG. 7 is a schematic cross-sectional side view illustration of a pillar 730 electrically conductive ground structure 130 in accordance with an embodiment. For example, pillar 730 may be a metal (e.g. copper) pillar or ring that is bonded to or plated on the package substrate 102.

Figure 8:
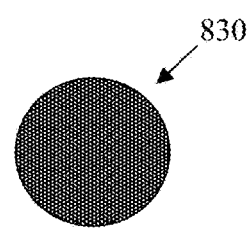
FIG. 8 is a schematic cross-sectional side view illustration of a solder ball in accordance with an embodiment.

FIG. 8 is a schematic cross-sectional side view illustration of a solder ball 830 electrically conductive ground structure 130 in accordance with an embodiment.

Figure 9:
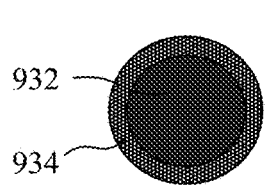
FIG. 9 is a schematic cross-sectional side view illustration of a cored ball in accordance with an embodiment.

FIG. 9 is a schematic cross-sectional side view illustration of a cored ball 930 electrically conductive ground structure 130 in accordance with an embodiment. For example, a cored ball 930 may include an inner metal core 932 (e.g. copper) and shell 934 (e.g. solder).

Figure 10:
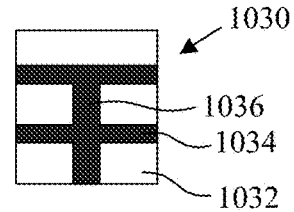
FIG. 10 is a schematic cross-sectional side view illustration of a silicon chip with electrical routing in accordance with an embodiment.

FIG. 10 is a schematic cross-sectional side view illustration of a chip 1030 electrically conductive ground structure 130 with electrical routing in accordance with an embodiment. As shown, the chip 1030 may include one or more wiring layers 1034 and vias 1036, for example, formed of copper. The chip 1030 may include support layers 1032 formed of silicon, or other suitable materials to support the one or more wiring layers 1034 and vias 1036 and provide mechanical integrity, for example during a cutting or sawing process.

Figure 11:
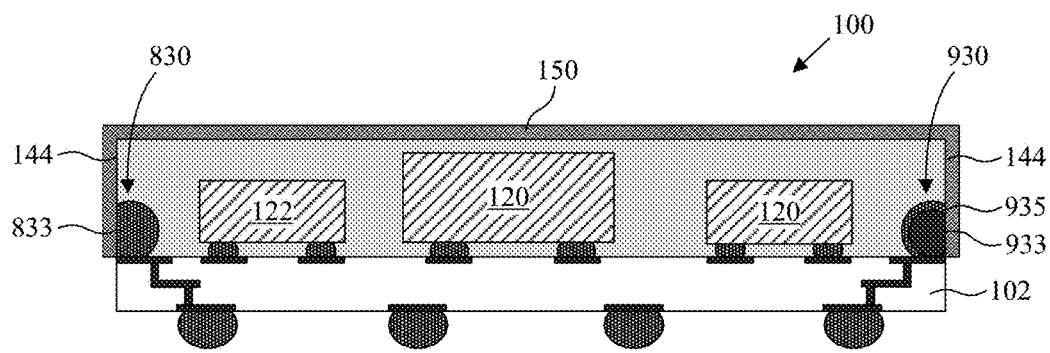
FIGS. 11-13 are schematic cross-sectional side view illustrations of packages including various electrically conductive ground structures in accordance with embodiments.
Figure 12:
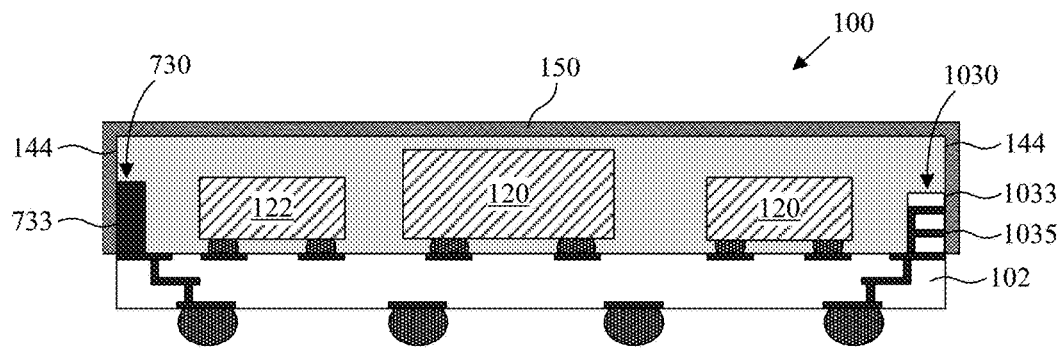
Figure 13:
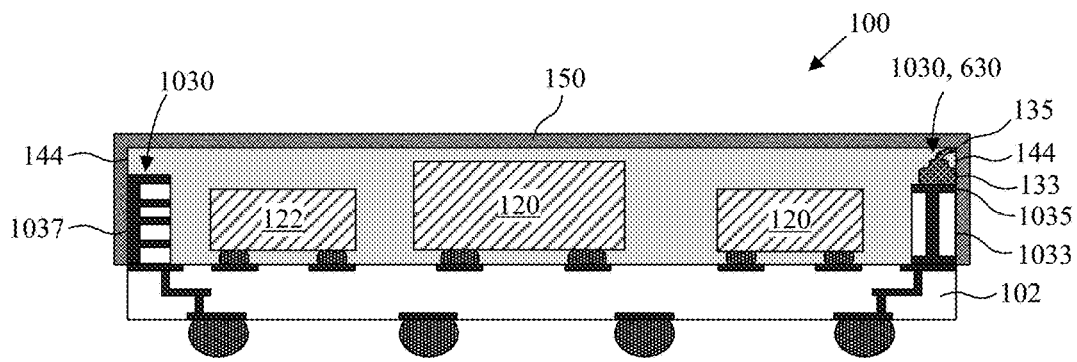

Referring now to FIGS. 11-13 schematic cross-sectional side view illustrations are provided of packages 100 including various electrically conductive ground structures in accordance with embodiments. As illustrated in FIG. 11, a solder ball 830 may include a surface 833 that is exposed at the side surfaces 144 of the molding compound 140, and in contact with the electrically conductive shield layer 150. Also illustrated in FIG. 11, a cored ball 930 may include a surface 933 of the core, and surface 935 of the shell 934 that are exposed at the side surfaces 144 of the molding compound 140, and in contact with the electrically conductive shield layer 150.

As illustrated in FIG. 12, a pillar 730 may include a surface 733 that is exposed at the side surfaces 144 of the molding compound 140, and in contact with the electrically conductive shield layer 150. Also illustrated in FIG. 12, a chip 1030 may include a surface 1035 of a wiring layer 1034, and optionally a surface 1033 of a support layer(s) 1032 that are exposed at the side surfaces 144 of the molding compound 140, and in contact with the electrically conductive shield layer 150.

As illustrated in FIG. 13, a chip 1030 may include a surface 1037 of a via 1036 exposed at the side surfaces 144 of the molding compound 140, and in contact with the electrically conductive shield layer 150. Also illustrated in FIG. 13 is a hybrid approach including a wire bond 630 on top of a chip 1030. A variety of conductive surfaces may be exposed at side surfaces of the molding compound 140 and in contact with the electrically conductive shield layer 150, including surfaces 133, 135, and/or 1035.

The packaging processes in accordance with embodiments may be compatible with a variety of electrically conductive ground structures 130 and techniques for applying the electrically conductive shield layer 150. Additionally, the packaging processes in accordance with embodiments may be compatible with BGA processing techniques, in which the packages 100 are fabricated on and singulated on a wiring substrate 200, which corresponds to the package substrate 102 after singulation. For example, the wiring substrate 200 may be in the form of a panel substrate or strip substrate compatible with BGA processing techniques.

Figure 14:
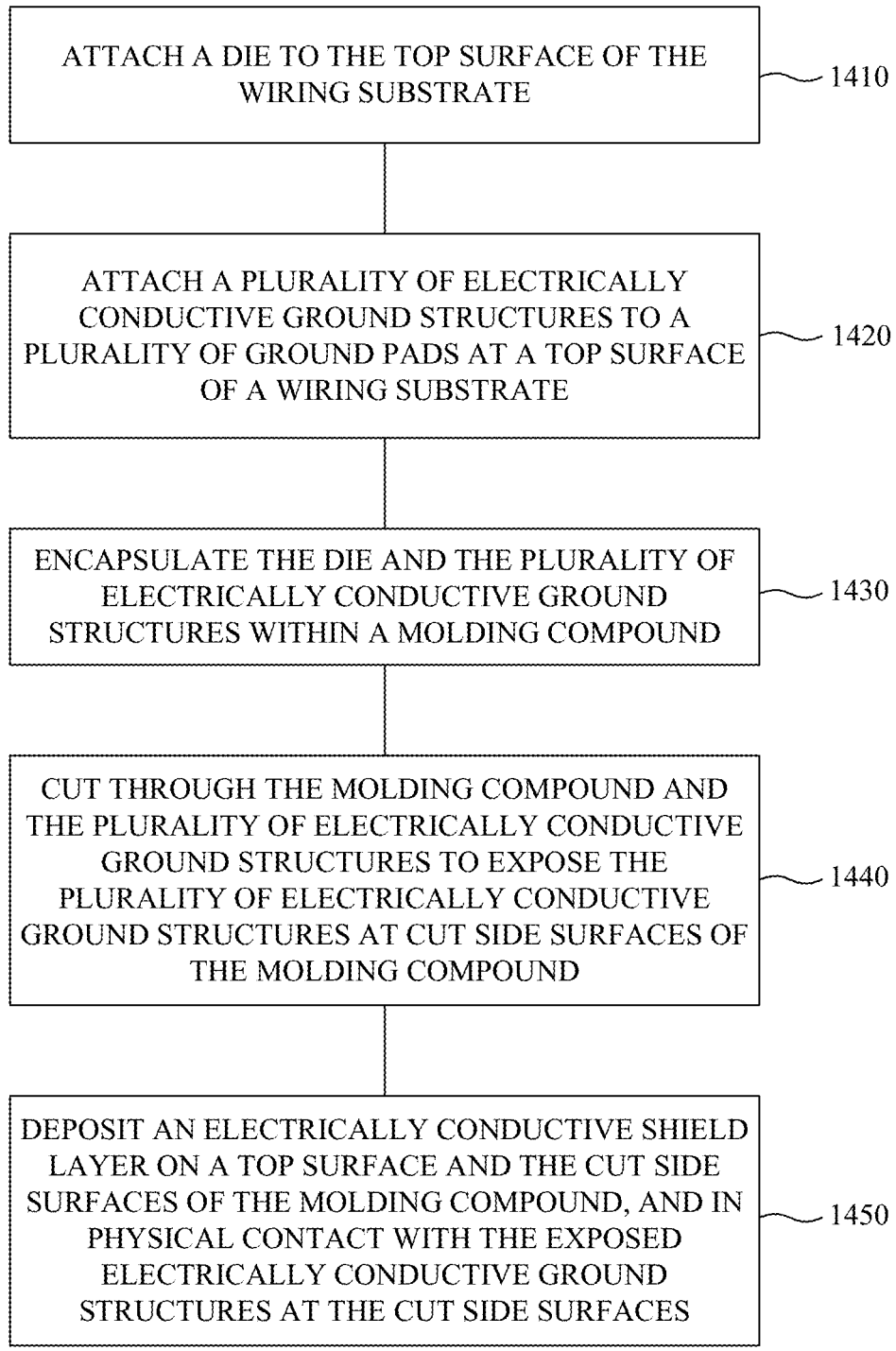
FIG. 14 is a flow chart illustrating a packaging method including depositing an electrically conductive shield layer on exposed electrically conductive ground structures in accordance with an embodiment.

FIG. 14 is a flow chart illustrating a packaging method including depositing an electrically conductive shield layer on exposed electrically conductive ground structures in accordance with an embodiment. In interest of clarity, the following description of FIG. 14 is made with regard to reference features found in other figures described herein. At operation 1420 a plurality of die 120 and/or components 122 are attached to a top surface of a wiring substrate 200 so that at least one die 120 and/or component 122 is located within a package area 101. At operation 1420 a plurality of electrically conductive ground structures 130 are attached to a plurality of ground pads 108 at the top surface 104 of the wiring substrate 200. A variety of electrically conductive ground structures 130 may be used, including those described and illustrated in FIGS. 6-10, as well as combinations thereof, such as described with regard to FIG. 13. In an embodiment, the order of operations 1410, 1420 may be reversed. The plurality of die 120 and/or components 122, and the plurality of electrically conductive ground structures 130 are then encapsulated within a molding compound 140 at operation 1430. Following encapsulation, at operation 1440 the molding compound 140 and plurality of electrically conductive ground structures 130 are cut, for example using a blade or saw, to expose the plurality of electrically conductive ground structures 130 at the cut side surfaces 144 of the molding compound 140. At operation 1450 an electrically conductive shield layer 150 is then deposited on the top surface 142 and the cut side surfaces 144 of the molding compound 140, and also in physical contact with exposed surfaces of the exposed electrically conductive ground structures 130 at the cut side surfaces 144.

The packaging methods in accordance with embodiments may be compatible with both half cut and full cut singulation processes. A packaging method illustrating a half cut singulation process is described and illustrated in FIGS. 15-26. In a half cut singulation process the electrically conductive shield layer 150 may be formed at the strip or panel level, potentially increasing throughput. A packaging method illustrating a full cut singulation process is described and illustrated in FIGS. 27-31. In one aspect, the packaging methods described in accordance with embodiments may be applied to a variety of different package substrates. For example, the packaging methods may be integrated at the strip level or panel level BGA packaging process. Furthermore, the packaging methods may be integrated with a variety of different substrates, for example, with minimum thicknesses and/or reduced wiring/routing layers. Thus, an electrically conductive shield layer 150 may be formed irrespective of the package substrate (or wiring substrate).

Figure 15:
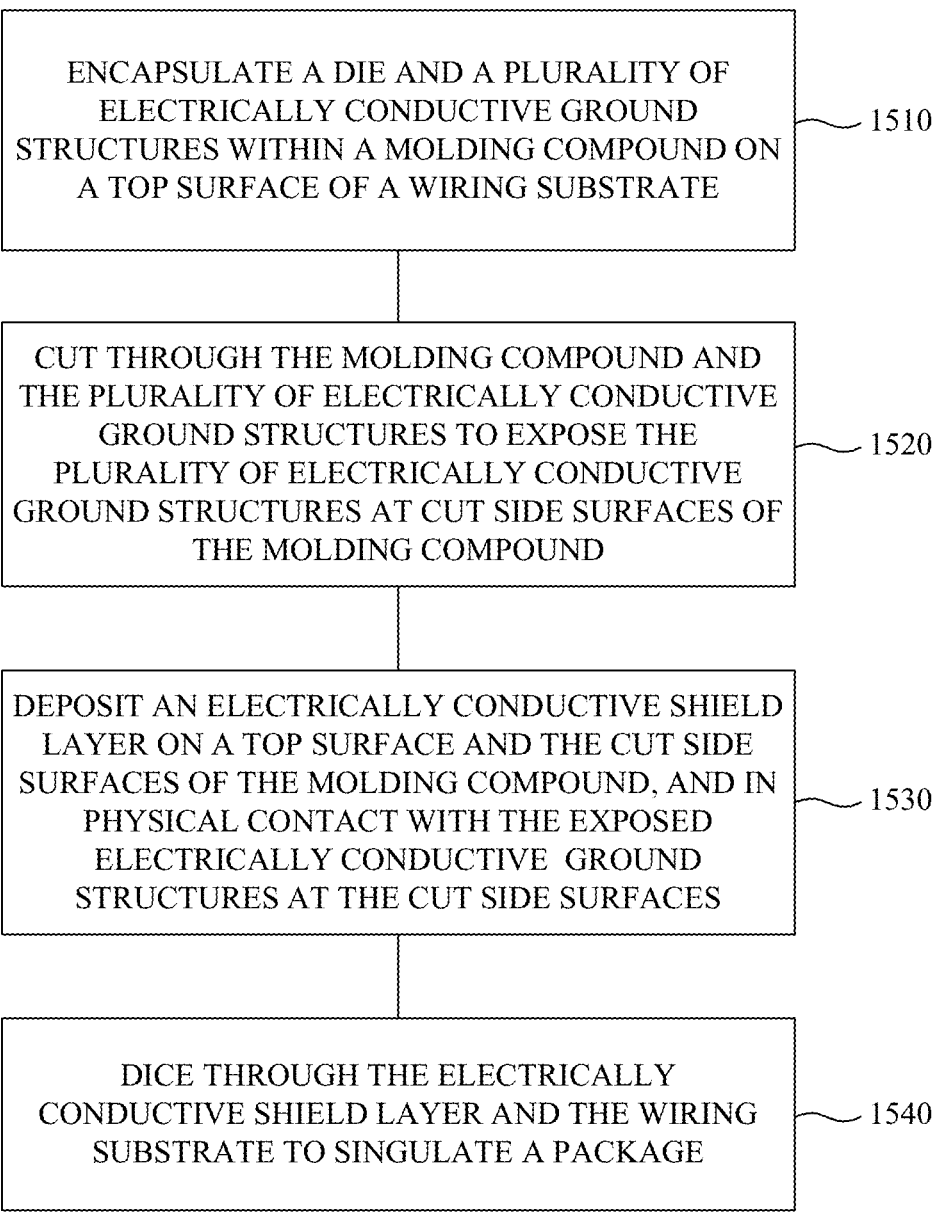
FIG. 15 is a flow chart illustrating a packaging method including a half cut singulation process in accordance with an embodiment.

FIG. 15 is a flow chart illustrating a packaging method including a half cut singulation process in accordance with an embodiment. In interest of clarity, the following description of FIG. 15 is made with regard to reference features found in other figures described herein. At operation 1510 a plurality of die 120 and/or components 122, and a plurality of electrically conductive ground structures 130 are encapsulated within a molding compound 140 on a top surface of a wiring substrate 200. At operation 1520 the molding compound 140 and plurality of electrically conductive ground structures 130 are cut, for example using a blade or saw, to expose the plurality of electrically conductive ground structures 130 at the cut side surfaces 144 of the molding compound 140. In such an embodiment, the cut does not extend completely through the wiring substrate 202, and may not extend into the wiring substrate 202. At operation 1530 an electrically conductive shield layer 150 is then deposited on the top surface 142 and the cut side surfaces 144 of the molding compound 140, and also in physical contact with exposed surfaces of the exposed electrically conductive ground structures 130 at the cut side surfaces 144. At operation 1540, the electrically conductive shield layer 150 and the wiring substrate 200 are diced through (e.g. half cut using a blade or saw) to singulate one or more packages 100 from the wiring substrate 200.

Figure 16:
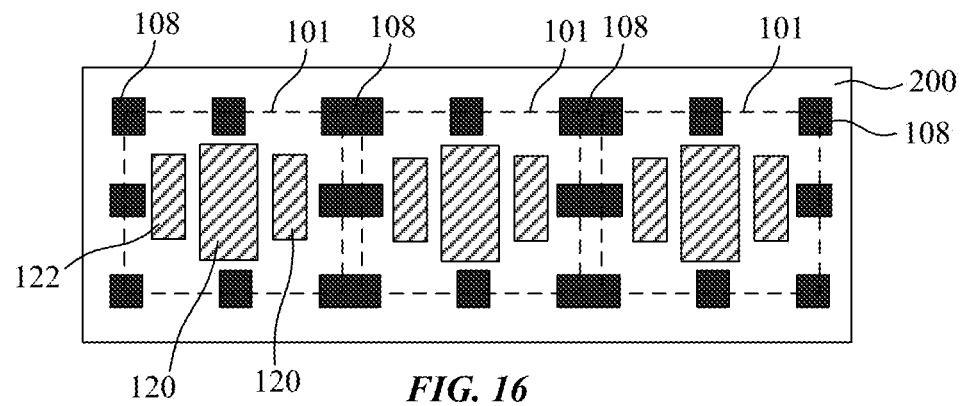
FIG. 16 is a schematic top view illustration of a wiring substrate including an arrangement of ground pads in accordance with an embodiment.

FIG. 16 is a schematic top view illustration of a wiring substrate 200 (e.g. strip substrate, panel substrate) including an arrangement of ground pads 108 in accordance with an embodiment. As shown, a plurality of package areas 101, or outlines, are provided to indicate where the cutting (e.g. sawing) streets will be. One or more die 120 and/or components 122 may be mounted onto the top surface 204 (not labeled in FIG. 16) of the wiring substrate 200 within one or more package areas 101. One or more ground pads 108 may also be located on the wiring substrate 200 top surface adjacent to a periphery of the package areas 101. In the embodiment illustrated, the ground pads 108 overlap the package areas 101 (outlines). In other embodiments, the ground pads 108 may be located within the package areas 101. In an embodiment, one or more ground pads 108 may be shared by adjacent package areas 101.

Figure 17:
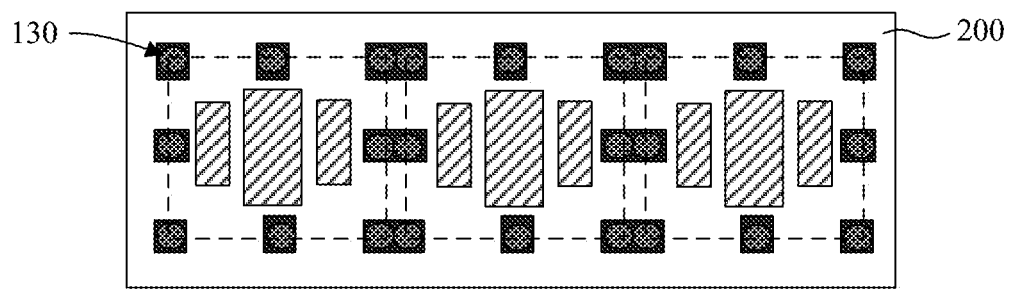
FIG. 17 is a schematic top view illustration of a wiring substrate including electrically conductive ground structures bonded to an arrangement of ground pads in accordance with an embodiment.

Referring to FIG. 17, a corresponding plurality of electrically conductive ground structures 130 may be bonded to the arrangement of ground pads 108. For example, the electrically conductive ground structures 130 may be any of those described and illustrated in FIGS. 6-10, as well as combinations thereof, such as described with regard to FIG. 13. In accordance with embodiments, the one or more electrically conductive ground structures 130 overlap the package areas 101.

In one embodiment, the electrically conductive ground structures are wire bonds. During the wire bonding process, a wire 134 is brought into contact with the ground pad 108, with the combination of heat, pressure, and/or ultrasonic energy leading to material deformation of the wire. The bond area 132 may be formed using techniques such as ball bonding or wedge bonding. Once the bond area 132 is made, the wire 134 may be broken off or moved and attached to another pad at the opposite end of the wire 134.

Figure 18:
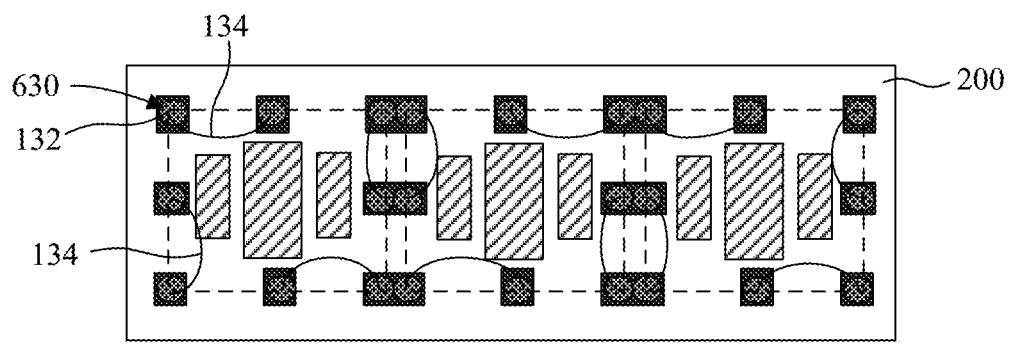
FIG. 18 is a schematic top view illustration of a wiring substrate including wire bonds bonded to an arrangement of ground pads in accordance with an embodiment.

Referring to FIG. 18 an embodiment is illustrated including a plurality of wire bonds 630 bonded to the plurality of ground pads 108. In the embodiment illustrated, the wires 134 of the wire bonds 630 may span between two ground pads 108 for the same package area 101. In such an embodiment, the wires 134 of the wire bonds 630 may remain in the completed package 100. The wires 134 of the wire bonds 630 may also span between two ground pads 108 of different package areas 101. In such an embodiment, the wires 134 may be cut when cutting through the molding compound and electrically conductive ground structure.

Figure 19:
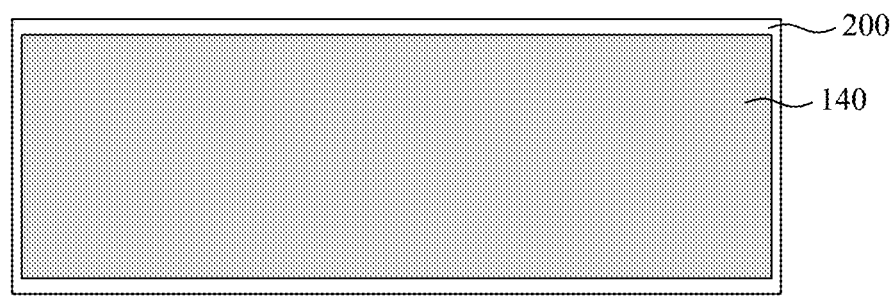
FIG. 19 is a schematic top view illustration of a wiring substrate after encapsulation with a molding compound in accordance with an embodiment.
Figure 20:
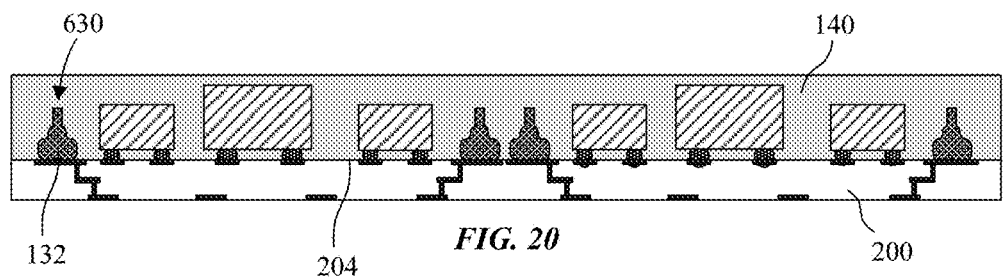
FIGS. 20-24 are schematic cross-sectional side view illustrations of a packaging method including a half cut singulation process in accordance with an embodiment.

The plurality of die 120 and/or components 122, and the plurality of electrically conductive ground structures 130 (e.g. of FIG. 16 or FIG. 17) are then encapsulated within a molding compound 140, as illustrated in FIG. 19. A schematic side view illustration of the encapsulated structure is illustrated in FIG. 20. The particular embodiment illustrated shows wire bonds 630 including bond areas 132, in which the wires 134 have been broken off. It is to be appreciated that this is an exemplary illustration, and embodiments are not so limited. Any of the electrically conductive ground structures 130 previously described can be utilized.

Figure 21:
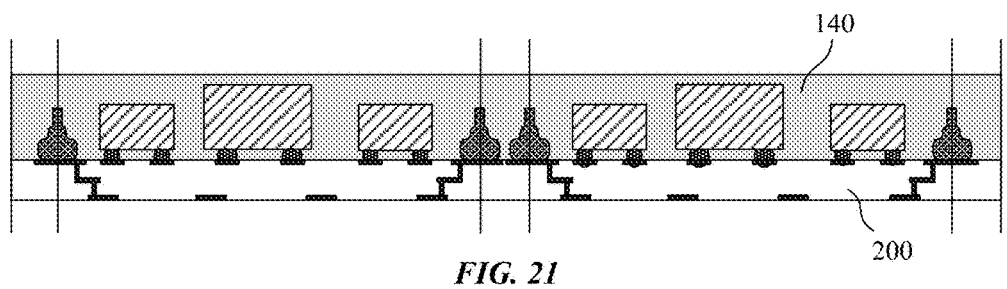
Figure 22:
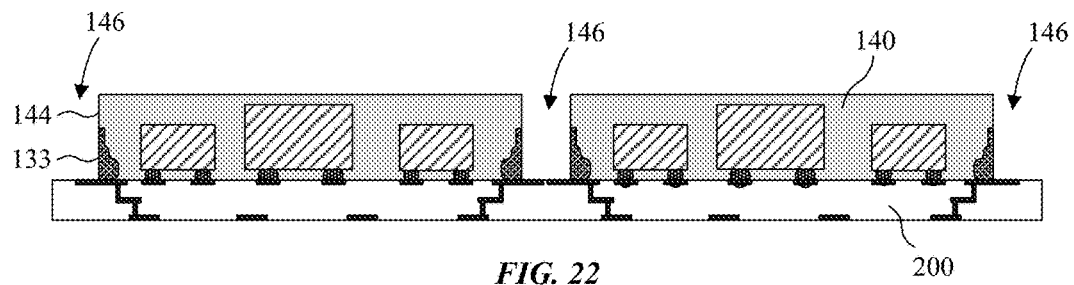

Referring now to FIGS. 21-22, sawing streets are illustrated prior to half cutting, and trenches 146 are illustrated after half cutting through the molding compound 140 and the plurality of electrically conductive ground structures (e.g. wire bonds 630) to expose cut side surfaces 144 of the molding compound and an exposed surface 133 (e.g. of the bond area 132) of the wire bonds 630. In accordance with embodiments, the half cut trenches 146 may extend slightly into the wiring substrate 200, stop on the top surface 204 of the wiring substrate 200, or not reach the wiring substrate 200 so long as the trenches extend at least partially through the electrically conductive ground structures (e.g. wire bonds 630). In an embodiment, a width of the trenches 146 corresponds to a saw blade width.

Figure 23:
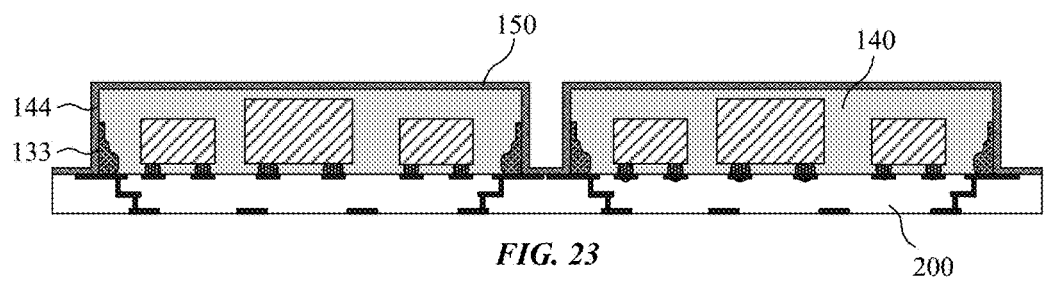

Referring now to FIG. 23, an electrically conductive shield layer 150 is then deposited on the top surface 142 and the cut side surfaces 144 of the molding compound 140, and also in physical contact with exposed surfaces 133 of the exposed electrically conductive ground structures (e.g. wire bonds 630) at the cut side surfaces 144. In accordance with embodiments, the electrically conductive shield layer 150 may be formed by spraying or sputtering to achieve a low cost and high throughput. Additional methods may also be used, including plating. Electrically conductive shield layer 150 may be formed of a variety of materials including metals (e.g. copper, etc.).

Figure 24:
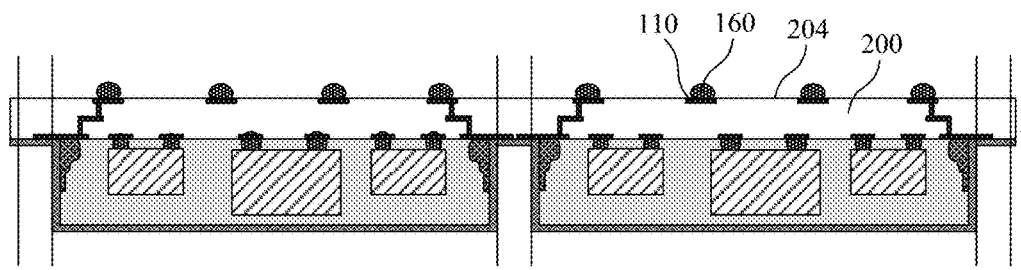

Conductive bumps 160 (e.g. solder balls) may optionally be attached to the bond pads 110 prior to or after formation of the electrically conductive shield layer 150. A second half cut may then be performed through the electrically conductive shield layer 150 and the wiring substrate to singulate one or more packages 100. Exemplary sawing streets are illustrated in FIG. 24. After singulation, the packages 100 may be in condition for bonding to a circuit board or mother board.

Figure 25:
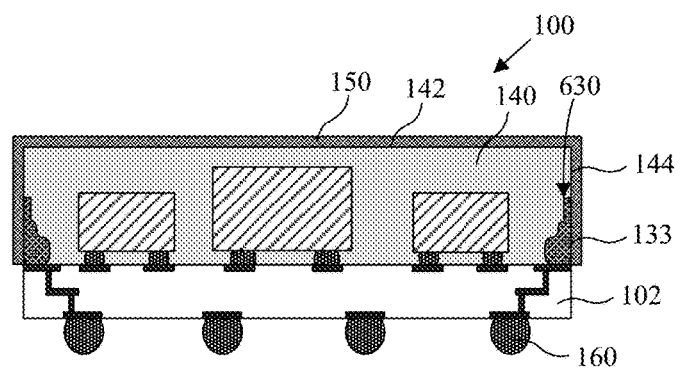
FIGS. 25-26 are schematic cross-sectional side view illustrations of a package in accordance with an embodiment.

FIG. 25 is a schematic cross-sectional side view illustration of package 100 fabricated using a half cut singulation process in accordance with an embodiments. The structure illustrated in FIG. 25 is substantially similar to that illustrated in FIG. 1, with one difference being the exemplary structure of the electrically conductive ground structures is a wire bond 630, without an exposed surface 135 of the cut wire 134. In accordance with embodiments, the electrically conductive ground structures of FIG. 25 may be any of those previously described and illustrated with regard to FIGS. 6-13.

Figure 26:
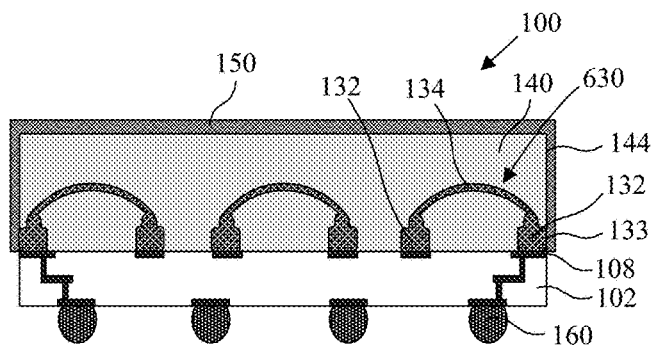

FIG. 26 is a schematic side view illustration of a package 100 including wire bonds 630 with wires 634 and bond areas 132 attached at both ends inside the package 100. Thus, the wire bonds 630, including the wires 134, may be embedded inside the molding compound 140. The wires 134 may additionally provide electrical connection between ground pads 108. The structure illustrated in FIG. 26 may be fabricated from a wiring substrate 200 such as that previously described and illustrated in FIG. 18, for example.

Figure 27:
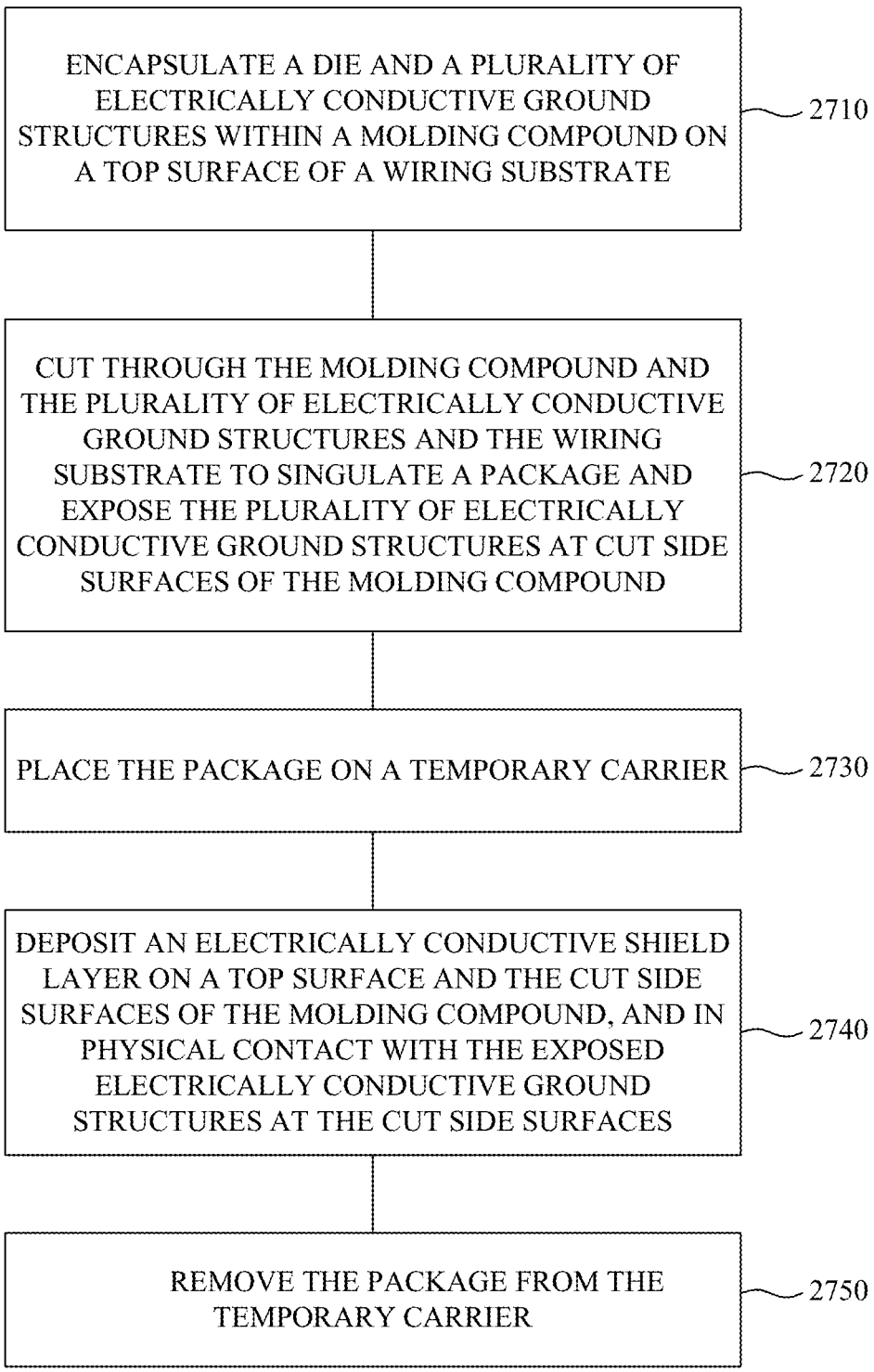
FIG. 27 is a flow chart illustrating a packaging method including a full cut singulation process in accordance with an embodiment.

While embodiments thus far have been described and illustrated with regard to a half cut singulation process, embodiments are not so limited and the packages 100 may also be fabricated using a full cut singulation process. FIG. 27 is a flow chart illustrating a packaging method including a full cut singulation process in accordance with an embodiment. In interest of clarity, the following description of FIG. 27 is made with regard to reference features found in other figures described herein. At operation 2710 a plurality of die 120 and/or components 122, and a plurality of electrically conductive ground structures 130 are encapsulated within a molding compound 140 on a top surface of a wiring substrate 200. At operation 2720 a full cut is made through the molding compound 140, the plurality of electrically conductive ground structures 130, and the wiring substrate 200, for example using a blade or saw, to singulate one or more packages 100 and expose the plurality of electrically conductive ground structures 130 at the cut side surfaces 144 of the molding compound 140. At operation 2730 the one or more packages 100 are placed on a temporary carrier 300 such as a tape or adhesive layer. At operation 2740 an electrically conductive shield layer 150 is then deposited on the top surface 142 and the cut side surfaces 144 of the molding compound 140, and also in physical contact with exposed surfaces of the exposed electrically conductive ground structures 130 at the cut side surfaces 144. At operation 2750 the packages 100 are removed from the temporary carrier 300.

Figure 28:
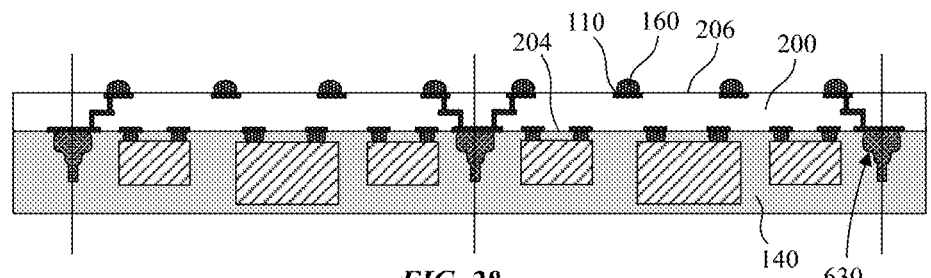
FIGS. 28-30 are schematic cross-sectional side view illustrations of a packaging method including a full cut singulation process in accordance with an embodiment.
Figure 29:
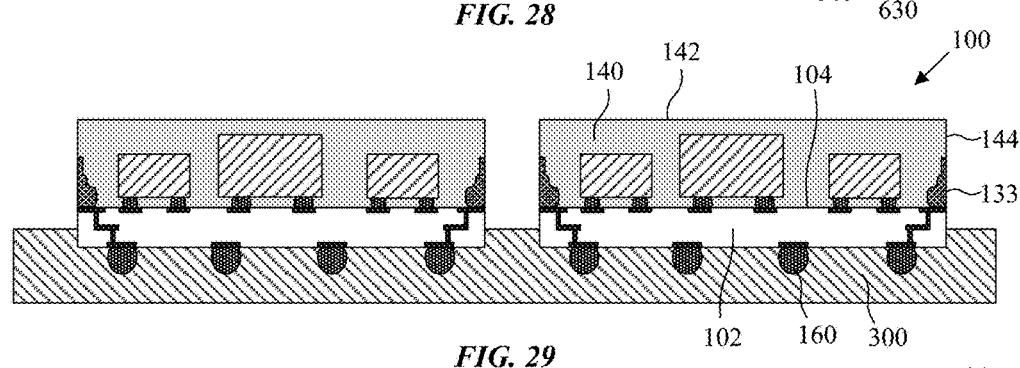
Figure 30:
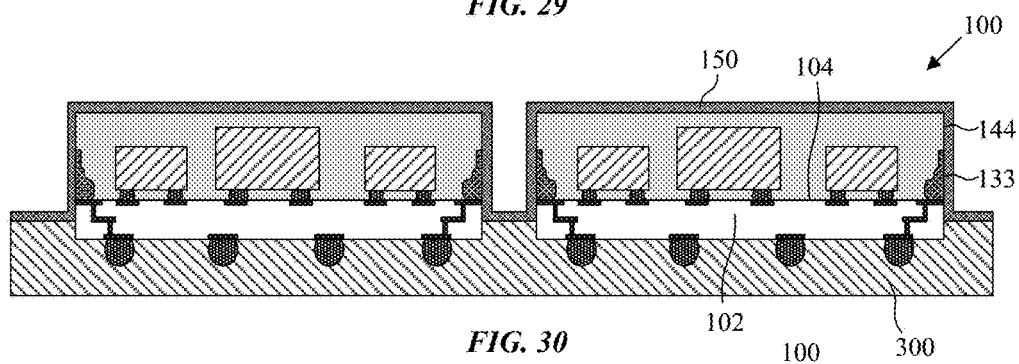

FIGS. 28-30 are schematic cross-sectional side view illustrations of a packaging method including a full cut singulation process in accordance with an embodiment. Referring to FIG. 28, the packaging method may have been performed similarly as the process sequence illustrated in FIGS. 16-20. After encapsulation with the molding compound 140, conductive bumps 160 (e.g. solder balls) may optionally be attached to the bond pads 110. Exemplary sawing streets are illustrated in FIG. 28, where a full cut singulation process may be performed in which a full cut is made through the molding compound 140, the plurality of electrically conductive ground structures 130 (e.g. the exemplary wire bonds 630 illustrated), and the wiring substrate 200, for example using a blade or saw, to singulate one or more packages 100 and expose the plurality of electrically conductive ground structures 130 (e.g. wire bonds 630) at the cut side surfaces 144 of the molding compound 140.

The one or more packages 100 may then be placed on a temporary carrier 300 such as a tape or adhesive layer, as illustrated in FIG. 29. An electrically conductive shield layer 150 may then deposited on the top surface 142 and the cut side surfaces 144 of the molding compound 140, and also in physical contact with exposed surfaces 133 of the exposed electrically conductive ground structures 130 (e.g. wire bonds 630) at the cut side surfaces 144, as illustrated in FIG. 30. As previously described, the packaging processes may be compatible with a variety of package substrates 102, irrespective of package substrate 102 thickness. For example, as illustrated in FIGS. 29-30 it is possible that a portion of the package substrate 102 thickness is embedded into the temporary carrier 300. Since the exposed surfaces 133 of the electrically conductive ground structures 130 (e.g. wire bonds 630) are elevated above the top surface 104 of the package substrate 102, a reliable contact may be made with the exposed surfaces 133 when depositing the electrically conductive shield layer 150, with mitigated risk of the exposed surfaces 133 being embedded within the temporary carrier 300 and, thus inaccessible.

Figure 31:
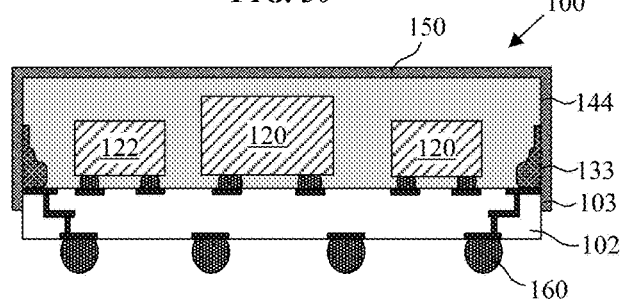
FIG. 31 is a schematic cross-sectional side view illustration of a package in accordance with an embodiment.

The packages 100 may then be removed from the temporary carrier, as illustrated in FIG. 31. The packages 100 illustrated in FIG. 31 may be similar to those previously illustrated and described with regard to FIG. 1, FIG. 25, or FIG. 26. One difference may be that the electrically conductive shield layer 150 may partially, or completely, span the side surfaces 103 of the package substrate 102. The electrically conductive shield layer 150 may potentially span the side surfaces 103 of the package substrate 102 using a half cut processing sequence as well.

Figure 32:
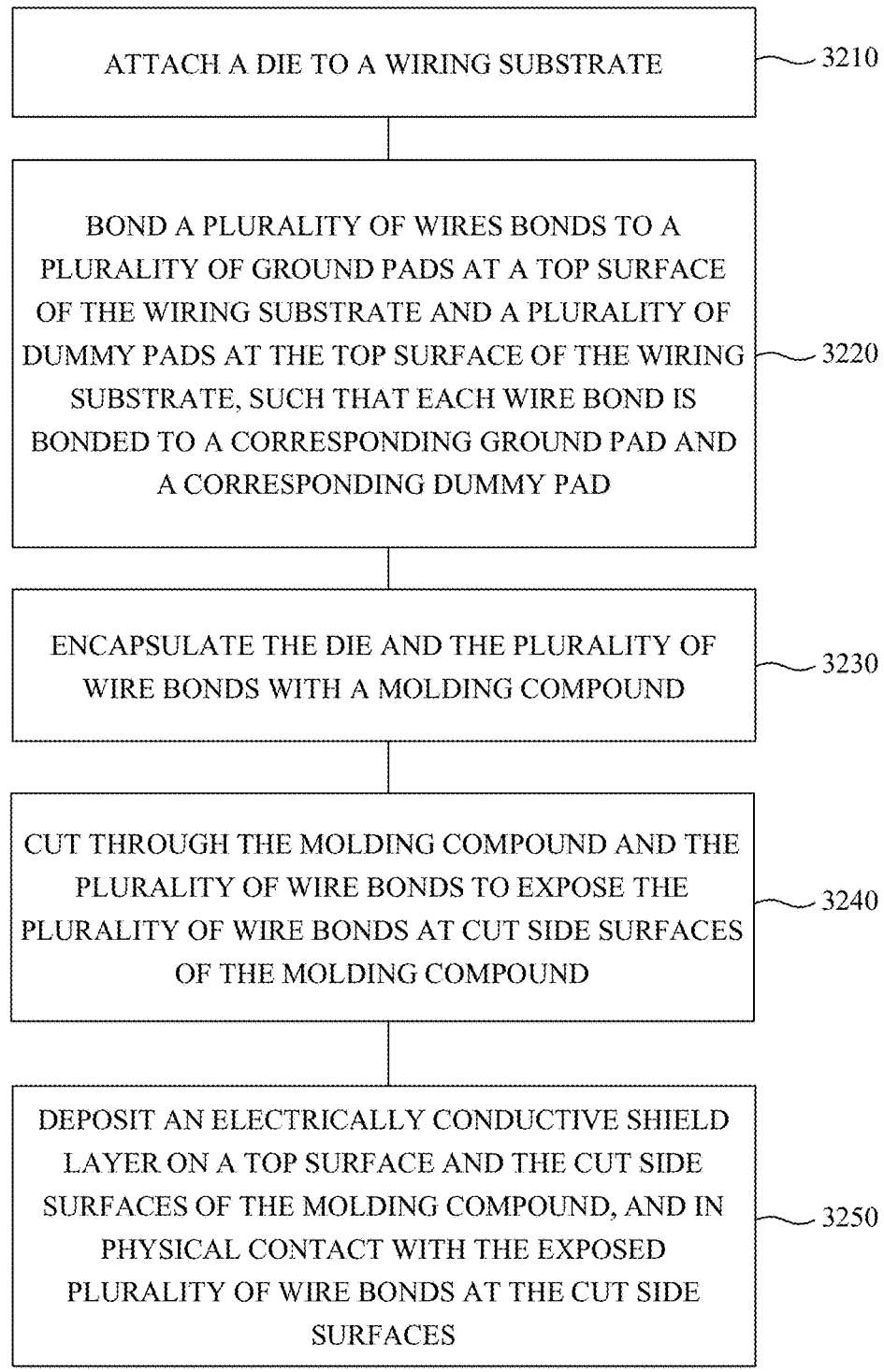
FIG. 32 is a flow chart illustrating a packaging method including wire bonding to dummy pads in accordance with an embodiment.

Referring now to FIG. 32 a flow chart illustrating a packaging method including wire bonding to dummy pads is provided in accordance with an embodiment. FIGS. 33-40 illustrate various schematic top view and cross-sectional side views of a packaging method including wire bonding to dummy pads is provided in accordance with an embodiment. In interest of clarity, FIG. 32 is described concurrently and with reference to FIGS. 33-40.

Figure 33:
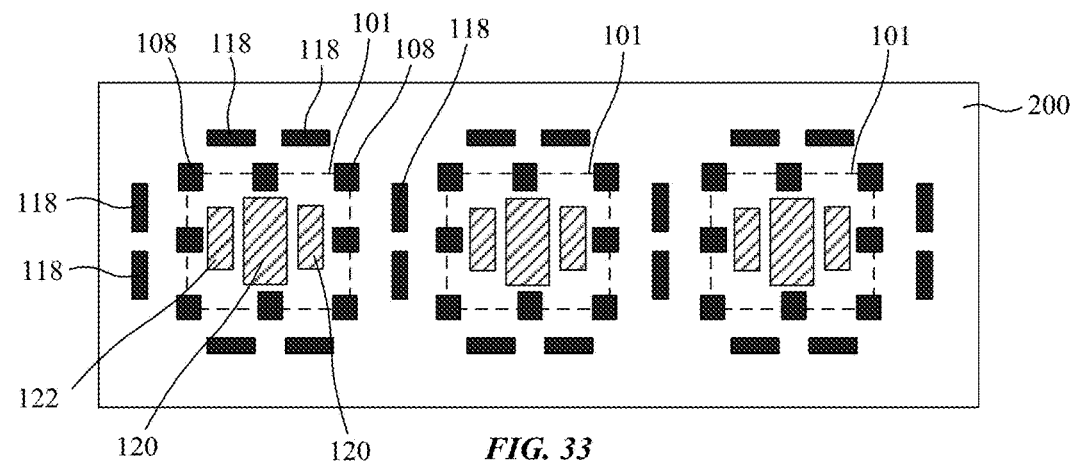
FIG. 33 is a schematic top view illustration of a wiring substrate including an arrangement of ground pads and dummy pads in accordance with an embodiment.
Figure 34:
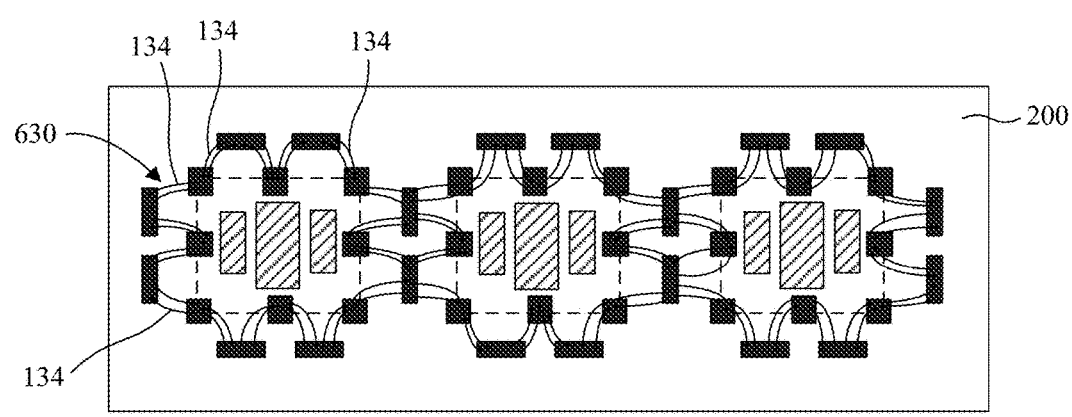
FIG. 34 is a schematic top view illustration of a wiring substrate including wire bonds bonded to an arrangement of ground pads and dummy pads in accordance with an embodiment.

At operation 3210 a plurality of die 120 and/or components 122 are attached to the top surface of the wiring substrate 200 (e.g. strip substrate, panel substrate) so that at least one die 120 and/or component 122 is located within each package area 101, as illustrated in FIG. 33. At operation 3220 a plurality of wire bonds are bonded to one or more ground pads 108 and one or more dummy pads 118 at a top surface 104 of a wiring substrate 200, such that each wire bond 630 is bonded to a corresponding ground pad 108 and a corresponding dummy pad 118, as illustrated in FIG. 34. In an embodiment, the order of operations 3210, 3220 may be reversed. As shown in FIGS. 33-34, the dummy pads 118 may be arranged around/outside peripheries of the package areas 101. In such an arrangement, the wire bond 630 wires 134 may extend from inside the package areas 101 to outside of the package areas 101. While the embodiments illustrated in FIGS. 32-33 show a plurality of ground pads 108 and dummy pads 118, embodiments are also compatible with a ground pad 108 ring and/or dummy pad 118 ring.

Figure 35:
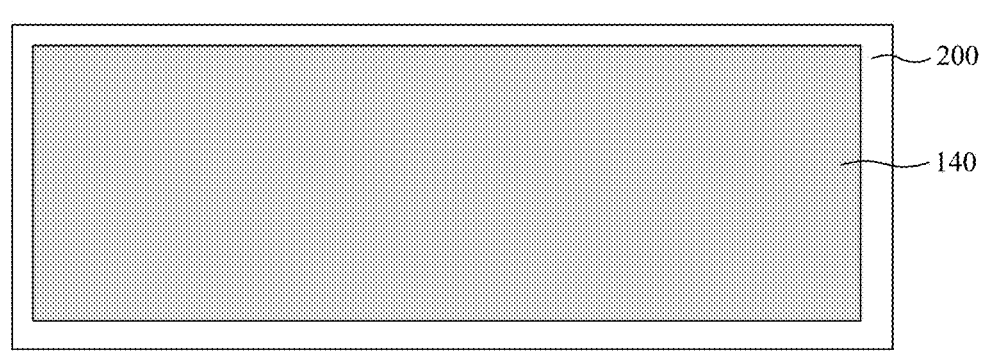
FIG. 35 is a schematic top view illustration of a wiring substrate after encapsulation with a molding compound in accordance with an embodiment.
Figure 36:
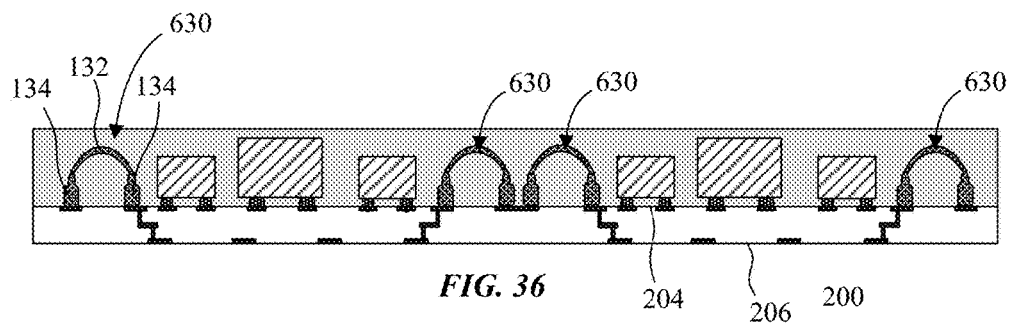
FIGS. 36-40 are schematic cross-sectional side view illustrations of a packaging method including wire bonding to dummy pads in accordance with an embodiment.
Figure 37:
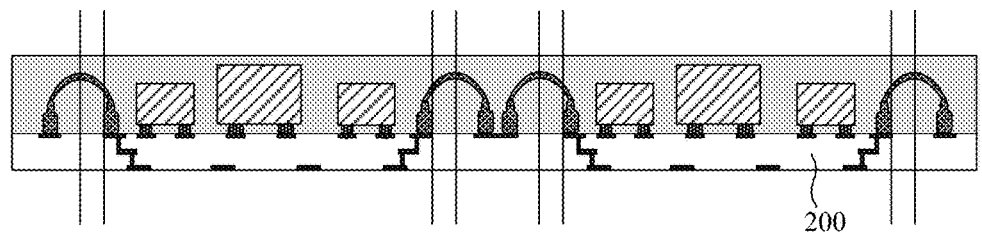
Figure 38:
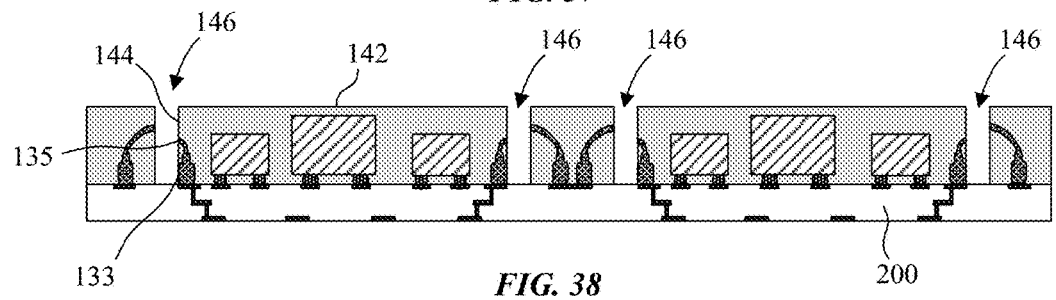

At operation 3230 the plurality of die 120 and/or components 122, and the plurality of wire bonds 630 are then encapsulated within a molding compound 140, as illustrated in FIGS. 35-36. Following encapsulation, at operation 3240 the molding compound 140 and wire bonds 630 are cut, for example using a blade or saw, to expose the plurality of wire bonds 630 at the cut side surfaces 144 of the molding compound 140. FIG. 37 illustrates a plurality of saw streets prior to cutting, and FIG. 38 illustrates a schematic cross-sectional side view of trenches 146 after a half cut. It is to be appreciated that while a half cut processing sequence is illustrated, that embodiments are not so limited and a full cut may also be made through the wiring substrate 200.

Still referring to FIG. 38, following the cut, whether half cut or full cut, surfaces 133 of the bond areas 132 may be exposed at the side surfaces 144, and/or surfaces 135 of the wires 134 may be exposed at the side surfaces 144. For example, a cross-section of a width or diameter of the wires 134 is exposed. In an embodiment, both surfaces 133, 135 of the bond areas 132 and the wires 134 are exposed at the side surfaces 144.

Figure 39:
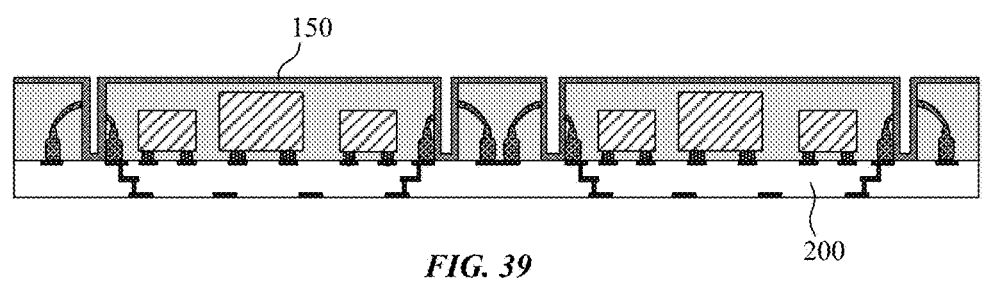
Figure 40:
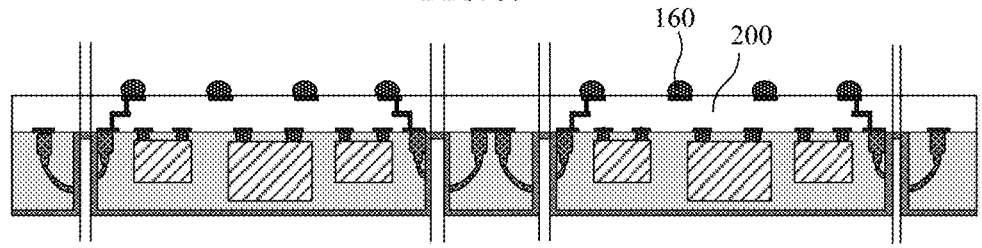

At operation 3250 an electrically conductive shield layer 150 (e.g. EMI shield layer) is then deposited on the top surface 142 and the cut side surfaces 144 of the molding compound 140, and also in physical contact with exposed surfaces of the exposed wire bonds 630 at the cut side surfaces 144, as illustrated in FIG. 39. In some embodiments, the electrically conductive shield layer 150 is not formed on side surfaces 103 of the package substrate 102, though the electrically conductive shield layer 150 may be formed on side surfaces 103 of the package substrate 102. In a half cut processing sequence, a plurality of packages may then be singulated along the saw lines illustrated in FIG. 40, resulting the package 100 structures illustrated in FIG. 1.

In utilizing the various aspects of the embodiments, it would become apparent to one skilled in the art that combinations or variations of the above embodiments are possible for forming package and package substrate for EMI shielding. Although the embodiments have been described in language specific to structural features and/or methodological acts, it is to be understood that the appended claims are not necessarily limited to the specific features or acts described. The specific features and acts disclosed are instead to be understood as embodiments of the claims useful for illustration.

What is claimed is:

1. A method comprising:
    attaching a die to a top surface of a wiring substrate;
    attaching a plurality of wire bonds to a plurality of ground pads and a plurality of dummy pads at the top surface of the wiring substrate such that each wire bond is attached to a corresponding ground pad and a corresponding dummy pad;
    encapsulating the die and the plurality of wire bonds within a molding compound;
    cutting through the molding compound and a corresponding plurality of bond areas of the plurality of wire bonds to expose a corresponding plurality of surfaces of the bond areas at cut side surfaces of the molding compound; and
    depositing an electrically conductive shield layer on a top surface and the cut side surfaces of the molding compound, and in physical contact with the plurality of surfaces of the exposed bond areas at the cut side surfaces of the molding compound.

2. The method of claim 1, further comprising dicing though the electrically conductive shield layer and the wiring substrate to singulate a package.

3. The method of claim 2, further comprising placing a plurality of solder balls on a bottom surface of the wiring substrate prior to dicing though the wiring substrate and the electrically conductive shield layer to singulate the package.

4. The method of claim 1, wherein cutting further comprises cutting through the wiring substrate to singulate a package.

5. The method of claim 4, further comprising placing the package on a temporary carrier, and depositing the electrically conductive shield layer on the top surface and the cut side surfaces of the molding compound, and in physical contact with the plurality of surfaces of the exposed bond areas at the cut side surfaces of the molding compound.

6. The method of claim 1, further comprising:
    attaching a first wire bond of the plurality of wire bonds to a first ground pad of the plurality of ground pads and a first dummy pad of the plurality of dummy pads, and attaching a second wire bond of the plurality of wire bonds to a second ground pad of the plurality of ground pads and the first dummy pad;
    cutting through the molding compound and a first bond area of the first wire bond to expose a first surface of the first bond area at a first cut side surface of the molding compound; and
    cutting through the molding compound and a second bond area of the second wire bond to expose a second surface of the second bond area at the first cut side surface of the molding compound.

7. The method of claim 6, further comprising dicing though the electrically conductive shield layer and the wiring substrate to singulate a package including the first surface of the first bond area and the second surface of the second bond area.

8. The method of claim 1, further comprising:
    attaching a first wire bond of the plurality of wire bonds to a first ground pad of the plurality of ground pads and a first dummy pad of the plurality of dummy pads, and attaching a second wire bond of the plurality of wire bonds to a second ground pad of the plurality of ground pads and the first dummy pad;
    cutting through the molding compound and a first bond area of the first wire bond to expose a first surface of the first bond area at a first cut side surface of the molding compound; and
    cutting through the molding compound and a second bond area of the second wire bond to expose a second surface of the second bond area at a second cut side surface of the molding compound.

9. The method of claim 8, further comprising dicing though the electrically conductive shield layer and the wiring substrate to singulate a first package including the first surface of the first bond area and a second package including the second surface of the second bond area.

10. The package of claim 5, further comprising:
    attaching a first wire bond of the plurality of wire bonds to a first ground pad of the plurality of ground pads and a first dummy pad of the plurality of dummy pads, and attaching a second wire bond of the plurality of wire bonds to a second ground pad of the plurality of ground pads and the first dummy pad;
    cutting through the molding compound and a first bond area of the first wire bond to expose a first surface of the first bond area at a first cut side surface of the molding compound; and cutting through the molding compound and a second bond area of the second wire bond to expose a second surface of the second bond area at the first cut side surface of the molding compound.

11. The package of claim 10, further comprising dicing though the electrically conductive shield layer and the wiring substrate to singulate the package including the first surface of the first bond area and the second surface of the second bond area.

12. The package of claim 5, further comprising:
attaching a first wire bond of the plurality of wire bonds to a first ground pad of the plurality of ground pads and a first dummy pad of the plurality of dummy pads, and attaching a second wire bond of the plurality of wire bonds to a second ground pad of the plurality of ground pads and the first dummy pad;
cutting through the molding compound and a first bond area of the first wire bond to expose a first surface of the first bond area at a first cut side surface of the molding compound; and
cutting through the molding compound and a second bond area of the second wire bond to expose a second surface of the second bond area at a second cut side surface of the molding compound.

13. The package of claim 12, further comprising dicing though the electrically conductive shield layer and the wiring substrate to singulate the package including the first surface of the first bond area, wherein the package does not include the second surface of the second bond area.

14. A package manufactured according to the method, comprising:
attaching a die to a wiring substrate;
bonding a plurality of wires bonds to a plurality of ground pads at a top surface of the wiring substrate and a plurality of dummy pads at the top surface of the wiring substrate, such that each wire bond is bonded to a corresponding ground pad and a corresponding dummy pad;
encapsulating the die and the plurality of wire bonds with a molding compound;
cutting through the molding compound and the plurality of wire bonds to expose a corresponding plurality of surfaces of the plurality of electrically conductive ground structures at cut side surfaces of the molding compound; and
depositing an electrically conductive shield layer on a top surface and the cut side surfaces of the molding compound, and in physical contact with the plurality of surfaces of the exposed plurality of wire bonds at the cut side surfaces of the molding compound.

15. The package of claim 14, wherein cutting through the plurality of wire bonds comprises cutting through bond areas of the plurality of wire bonds.

16. The package of claim 15, wherein the bond areas are selected from the group consisting of ball bond areas and wedge bond areas.

17. The package of claim 14, wherein cutting through the plurality of wire bonds comprises cutting through wires of the plurality of wire bonds.

* * * * *

UNITED STATES PATENT AND TRADEMARK OFFICE
CERTIFICATE OF CORRECTION

PATENT NO. : 9,793,222 B1  
APPLICATION NO. : 15/135071  
DATED : October 17, 2017  
INVENTOR(S) : MyungHo Lee Page 1 of 1

It is certified that error appears in the above-identified patent and that said Letters Patent is hereby corrected as shown below:

Column 15,  
Line 30, Claim 14, delete "the" and insert in place there of -- a --.

Signed and Sealed this  
Twenty-eighth Day of May, 2019

Andrei Iancu  
*Director of the United States Patent and Trademark Office*

UNITED STATES PATENT AND TRADEMARK OFFICE
CERTIFICATE OF CORRECTION

PATENT NO. : 9,793,222 B1
APPLICATION NO. : 15/135071
DATED : October 17, 2017
INVENTOR(S) : MyungHo Lee It is certified that error appears in the above-identified patent and that said Letters Patent is hereby corrected as shown below:

In the Claims

Column 13, Line 49-Column 16, Line 30, delete Claims 1-17, and replace with the following Claims 1-17:

What is claimed is:
1. A method comprising:
attaching a die to a top surface of a wiring substrate;
attaching a plurality of wire bonds to a plurality of ground pads and a plurality of dummy pads at the top surface of the wiring substrate such that each wire bond is attached to a corresponding ground pad and a corresponding dummy pad;
encapsulating the die and the plurality of wire bonds within a molding compound;
cutting through the molding compound and a corresponding plurality of bond areas of the plurality of wire bonds to expose a corresponding plurality of surfaces of the bond areas at cut side surfaces of the molding compound; and
depositing an electrically conductive shield layer on a top surface and the cut side surfaces of the molding compound, and in physical contact with the plurality of surfaces of the exposed bond areas at the cut side surfaces of the molding compound.

2. The method of claim 1, further comprising dicing though the electrically conductive shield layer and the wiring substrate to singulate a package.

3. The method of claim 2, further comprising placing a plurality of solder balls on a bottom surface of the wiring substrate prior to dicing though the wiring substrate and the electrically conductive shield layer to singulate the package.

4. The method of claim 1, wherein cutting further comprises cutting through the wiring substrate to singulate a package.

Signed and Sealed this
Thirteenth Day of August, 2019

Andrei Iancu
*Director of the United States Patent and Trademark Office*

5. The method of claim 4, further comprising placing the package on a temporary carrier, and depositing the electrically conductive shield layer on the top surface and the cut side surfaces of the molding compound, and in physical contact with the plurality of surfaces of the exposed bond areas at the cut side surfaces of the molding compound.

6. The method of claim 1, further comprising:
attaching a first wire bond of the plurality of wire bonds to a first ground pad of the plurality of ground pads and a first dummy pad of the plurality of dummy pads, and attaching a second wire bond of the plurality of wire bonds to a second ground pad of the plurality of ground pads and the first dummy pad;
cutting through the molding compound and a first bond area of the first wire bond to expose a first surface of the first bond area at a first cut side surface of the molding compound; and
cutting through the molding compound and a second bond area of the second wire bond to expose a second surface of the second bond area at a second cut side surface of the molding compound.

7. The method of claim 6, further comprising dicing though the electrically conductive shield layer and the wiring substrate to singulate a first package including the first surface of the first bond area and a second package including the second surface of the second bond area.

8. The method of claim 1, further comprising:
attaching a first wire bond of the plurality of wire bonds to a first ground pad of the plurality of ground pads and a first dummy pad of the plurality of dummy pads, and attaching a second wire bond of the plurality of wire bonds to a second ground pad of the plurality of ground pads and the first dummy pad;
cutting through the molding compound and a first bond area of the first wire bond to expose a first surface of the first bond area at a first cut side surface of the molding compound; and
cutting through the molding compound and a second bond area of the second wire bond to expose a second surface of the second bond area at the first cut side surface of the molding compound.

9. The method of claim 8, further comprising dicing though the electrically conductive shield layer and the wiring substrate to singulate a package including the first surface of the first bond area and the second surface of the second bond area.

10. A package manufactured according to a method, comprising:
attaching a die to a wiring substrate;
bonding a plurality of wires bonds to a plurality of ground pads at a top surface of the wiring substrate and a plurality of dummy pads at the top surface of the wiring substrate, such that each wire bond is bonded to a corresponding ground pad and a corresponding dummy pad;
encapsulating the die and the plurality of wire bonds with a molding compound;
cutting through the molding compound and the plurality of wire bonds to expose a corresponding plurality of surfaces of the plurality of electrically conductive ground structures at cut side surfaces of the molding compound; and
depositing an electrically conductive shield layer on a top surface and the cut side surfaces of the molding compound, and in physical contact with the plurality of surfaces of the exposed plurality of wire bonds at the cut side surfaces of the molding compound.

11. The package of claim 10, wherein cutting through the plurality of wire bonds comprises cutting through bond areas of the plurality of wire bonds.

12. The package of claim 11, wherein the bond areas are selected from the group consisting of ball bond areas and wedge bond areas.

13. The package of claim 10, wherein cutting through the plurality of wire bonds comprises cutting through wires of the plurality of wire bonds.

14. The package of claim 10, further comprising:
attaching a first wire bond of the plurality of wire bonds to a first ground pad of the plurality of ground pads and a first dummy pad of the plurality of dummy pads, and attaching a second wire bond of the plurality of wire bonds to a second ground pad of the plurality of ground pads and the first dummy pad;
cutting through the molding compound and a first bond area of the first wire bond to expose a first surface of the first bond area at a first cut side surface of the molding compound; and
cutting through the molding compound and a second bond area of the second wire bond to expose a second surface of the second bond area at the first cut side surface of the molding compound.

15. The package of claim 14, further comprising dicing though the electrically conductive shield layer and the wiring substrate to singulate the package including the first surface of the first bond area and the second surface of the second bond area.

16. The package of claim 10, further comprising:
attaching a first wire bond of the plurality of wire bonds to a first ground pad of the plurality of ground pads and a first dummy pad of the plurality of dummy pads, and attaching a second wire bond of the plurality of wire bonds to a second ground pad of the plurality of ground pads and the first dummy pad;
cutting through the molding compound and a first bond area of the first wire bond to expose a first surface of the first bond area at a first cut side surface of the molding compound; and
cutting through the molding compound and a second bond area of the second wire bond to expose a second surface of the second bond area at a second cut side surface of the molding compound.

17. The package of claim 16, further comprising dicing though the electrically conductive shield layer and the wiring substrate to singulate the package including the first surface of the first bond area, wherein the package does not include the second surface of the second bond area.